United States Patent [19]
Barkatullah et al.

[11] Patent Number: 5,706,485
[45] Date of Patent: Jan. 6, 1998

[54] METHOD AND APPARATUS FOR SYNCHRONIZING CLOCK SIGNALS IN A MULTIPLE DIE CIRCUIT INCLUDING A STOP CLOCK FEATURE

[75] Inventors: Javed Barkatullah, Portland; R. Kenneth Hose, Jr., Aloha, both of Oreg.

[73] Assignee: Intel Corporation, Santa Clara, Calif.

[21] Appl. No.: 536,195

[22] Filed: Sep. 29, 1995

Related U.S. Application Data

[63] Continuation of Ser. No. 124,823, Sep. 21, 1993, abandoned.

[51] Int. Cl.⁶ .................................................. H03K 5/14
[52] U.S. Cl. ............................................................ 395/552
[58] Field of Search .................................... 395/552, 551

[56] References Cited

U.S. PATENT DOCUMENTS

| | | | |
|---|---|---|---|
| 4,134,073 | 1/1979 | MacGregor | 327/161 |
| 4,415,984 | 11/1983 | Gryger et al. | 395/552 |
| 4,490,821 | 12/1984 | Lacher | 371/1 |
| 4,694,291 | 9/1987 | Denhez et al. | 340/825.2 |
| 4,835,728 | 5/1989 | Si et al. | 395/552 |
| 4,868,522 | 9/1989 | Popat et al. | 331/2 |
| 4,937,812 | 6/1990 | Itoh et al. | 370/246 |
| 4,965,857 | 10/1990 | Auracher et al. | 359/158 |
| 5,038,276 | 8/1991 | Bozzetti et al. | 395/293 |
| 5,086,500 | 2/1992 | Greub | 395/552 |
| 5,261,081 | 11/1993 | White et al. | 395/559 |
| 5,274,796 | 12/1993 | Conner | 395/551 |
| 5,309,035 | 5/1994 | Watson et al. | 327/141 |
| 5,355,468 | 10/1994 | Jeppesen et al. | 395/183.1 |
| 5,361,277 | 11/1994 | Grover | 375/356 |
| 5,398,262 | 3/1995 | Ahuja | 375/356 |
| 5,410,263 | 4/1995 | Waizman | 327/141 |

*Primary Examiner*—Parshotam S. Lall
*Assistant Examiner*—Kenneth R. Coulter
*Attorney, Agent, or Firm*—Blakely, Sokoloff, Taylor & Zafman

[57] ABSTRACT

A circuit contains a microprocessor die, containing a microprocessor, and a cache memory die, containing a cache memory, for operation in conjunction with the microprocessor. A microprocessor clock and a cache memory clock are generated for operation of the microprocessor and the cache memory, respectively. The microprocessor and cache memory clocks are generated on the microprocessor die, and the cache memory clock is transmitted to the cache memory die. In order to transmit data between the microprocessor die and the cache memory die, clock cycles are designated. The microprocessor clock and the cache memory clock are synchronized to the clock cycles including compensation for the propagation delay between the two dies. The microprocessor includes a stop clock function which halts the cache memory clock and the microprocessor clock on the same clock cycle so that data integrity, in both the microprocessor and cache memory, are maintained. In order to provide functional operation over a range of clock cycle frequencies, the data, from cache memory die, becomes valid on the falling edge of the cache clock signal, and is subsequently sampled, in the same clock cycle, on the rising edge of the microprocessor clock.

23 Claims, 7 Drawing Sheets

METHOD AND APPARATUS FOR SYNCHRONIZING CLOCK SIGNALS IN A MULTIPLE DIE CIRCUIT INCLUDING A STOP CLOCK FEATURE

This is a continuation of application Ser. No. 08/124,823, filed Sep. 21, 1993 now abandoned.

BACKGROUND OF THE INVENTION

1. Field of the Invention

The present invention relates to data transfer, and more specifically to methods and apparatus for synchronizing clock cycles in a circuit having multiple dies.

2. Art Background

Complex electronic circuits are often implemented on more than one silicon chip or die. The use of multiple dies permits system design utilizing readily available integrated circuit devices. However, when the multiple die circuit is connected, such as on a printed circuit board, the dies are physically separated. The physical distance among multiple dies may be great for circuits implemented on large printed circuit boards. If the multiple die circuit requires data transfer, a designer must account for the transmission line characteristics to ensure proper circuit operation. As process technology permits fabrication of digital integrated circuits capable of operating at high clock frequencies, transmission line issues become more prevalent.

Typically, in data processing systems, data are transferred on busses via bus cycles. The bus cycles operate in accordance with a specification, and in order to interface agents to the bus, the agents must adhere to the bus specification. The bus cycles require timing, such as a clock signal, wherein all bus agents must be synchronized to the clock signal. Consequently, a clock signal, synchronized at each die, must be generated. If multiple clock signals are generated on a single die, entitled the host die, transmitting the clock signal to other dies results in a phase delay of the clock signal at the receiving die. In order to synchronize the clock signals on each die, a first clock signal, generated on the host die, may be delayed. However, delaying this first clock on the host die induces physical jitter in the clock signal. Furthermore, the host die may comprise circuitry constituting the most important aspect of the circuit. The physical jitter caused from the clock signal delay may result in a degradation in circuit operation.

In microprocessor circuits, instructions are executed in conjunction with a microprocessor clock. It is desirable to include in a microprocessor a halt feature whereby the microprocessor halts operation by suspending the microprocessor clock upon occurrence of certain conditions. However, halting the microprocessor clock in the middle a microprocessor clock cycle may result in the microprocessor residing in an indeterminate state. In addition, it is desirable to halt other peripheral devices interfaced to the microprocessor upon termination of the same clock cycle.

It is often desirable to permit a microprocessor circuit to operate over a wide range of clock frequencies. If the microprocessor is interfaced to other devices, such as a cache memory, then the data interface must also operate over a wide range of clock frequencies. Therefore, it is desirable to change the clock frequency while remaining compatible with existing interfaces.

SUMMARY OF THE INVENTION

Therefore, it is an object of the present invention to synchronize clock signals for data transfer in a high speed digital circuit implemented on multiple dies.

It is a further object of the present invention to synchronize clock signals on multiple dies while minimizing physical jitter on the clock signals.

It is another object of the present invention to halt clock signals on all dies in a multiple die circuit so as to terminate on the end of the same clock cycle.

It is another object of the present invention to transmit data among dies in a multiple die circuit such that scaling of the clock frequency does not affect operation of the bus cycle.

These and other objects of the present invention are realized in an arrangement which includes a circuit containing a microprocessor die and a cache memory die. The cache memory die contains a cache memory for operation in conjunction with the microprocessor, and is connected to the microprocessor via a bus. In an alternative embodiment, the microprocessor die may be connected to a plurality of cache memories to form a multilevel cache system. In general, the microprocessor die contains a processing unit and a clock generation circuit. The processing unit incorporates a variety of microprocessor functions including a stop clock feature. The clock generation circuit generates a microprocessor clock signal and a cache clock signal.

The microprocessor clock signal is input directly to the processing unit for timing and operation of the microprocessor circuit. The cache clock is transmitted from the microprocessor die to the cache memory die. The physical distance between the microprocessor die and the cache memory die results in a propagation delay when transmitting the cache clock signal from the microprocessor die to the cache memory die. In order to transmit data between the microprocessor die and the cache memory die, clock synchronization is required. The microprocessor clock signal and the cache clock signal are synchronized, including compensation for the propagation delay, by providing an inverse of the cache clock signal at the output of clock generation circuit. The clock cycles for the data transfer timing are defined such that the cache clock signal leads the microprocessor clock signal in phase by 180° on the microprocessor die. By designating the clock cycle to begin at the cache clock signal 180° before the microprocessor clock signal, no delay of the microprocessor clock signal is required. In order to provide precise synchronization of the microprocessor and cache clock signals, delay may be introduced to the cache clock signal.

The clock generation circuit contains a stop clock circuit to implement the stop clock feature. The stop clock circuit receives a stop clock signal from the processing unit. The stop clock circuit ensures that the microprocessor clock signal and the cache clock signal halt on the end of the same clock cycle so that data integrity, in both the microprocessor and cache memory, are maintained.

When the processing unit requests data from the cache memory, and the request results in a cache hit, data are transmitted from the cache memory die to the microprocessor die via the bus. In order to provide functional operation over a range of clock cycle frequencies, the data, from cache memory die, become valid on the falling edge of the cache clock signal. The data are then sampled, in the same clock cycle, on the rising edge of the microprocessor clock.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION OF THE INVENTION

Methods and apparatus for clock synchronization in a circuit having multiple dies including a stop clock feature are disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
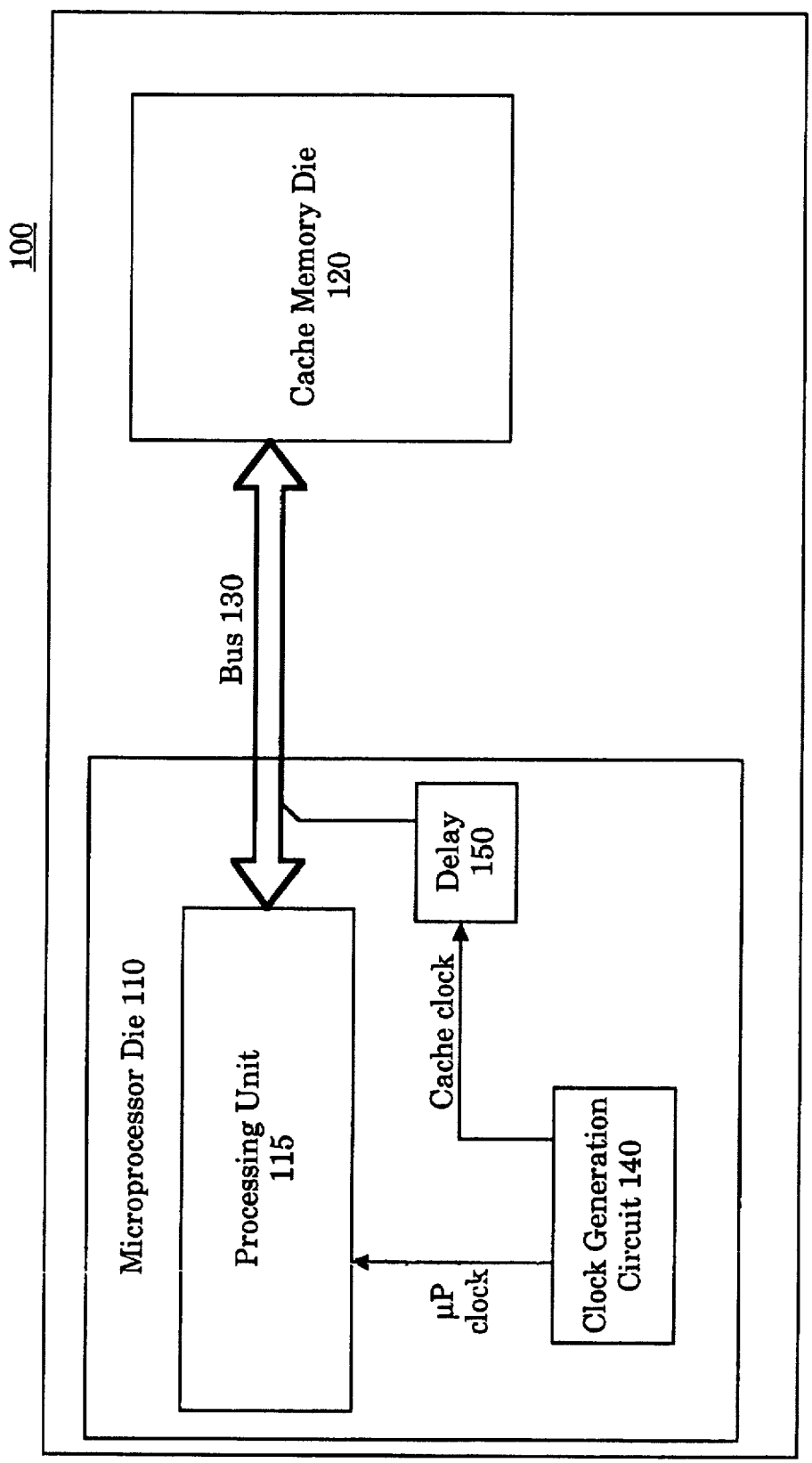
FIG. 1 illustrates an integrated circuit containing multiple dies configured in accordance with the present invention.

Referring to FIG. 1, an integrated circuit containing multiple dies configured in accordance with the present invention is illustrated. In a preferred embodiment of the present invention, an integrated circuit 100 contains a microprocessor die 110 and a cache memory die 120. Although integrated circuit 100 is shown containing a microprocessor die and a cache memory die, any multiple die circuit utilizing a synchronized clock may be substituted without deviating from the spirit and scope of the present invention. For example, the integrated circuit 100 may contain a microprocessor die circuit operating in conjunction with a mathematical coprocessor die circuit. Although the integrated circuit 100 contains two dies in a single package, the present invention relates to any multiple die circuit, and therefore any number of dies, constructed of either silicon or gallium arsenide, may be implemented without deviating from the spirit or scope of the invention. Furthermore, the present invention is not limited to the multiple dies being contained within a single ceramic or plastic package.

For purposes of explanation, the microprocessor die 110 is shown operating with a single cache memory die 120. The cache memory die 120 comprises a cache memory for operation in conjunction with microprocessor 110. The microprocessor die 110 is connected to the cache memory die 120 via a bus 130. In an alternative embodiment, the microprocessor die 110 may be connected to a plurality of cache memory to form a multilevel cache system. The bus 130 permits data communication between the microprocessor die 110 and the cache memory die 120. The bus 130 is intended to represent a broad category of data communication devices which are well known in the art and will not be described further.

In general, the microprocessor die 110 contains a processing unit 115, and a clock generation circuit 140. For purposes of explanation, the microprocessor die 110 is entitled the host die because the microprocessor die 110 contains the clock generation circuit 140. The cache memory die 120 is entitled the secondary die because cache memory die 120 receives a clock generated from the host die. The processing unit 115 incorporates a variety of microprocessor functions such as decoding and executing instructions, and providing a memory interface. In a preferred embodiment of the present invention, the processing unit 115 comprises a superscaler microprocessor. In order to operate the microprocessor die 110 and cache memory die 120 in conjunction, clock synchronization is required. The clock generation circuit 140 generates a microprocessor clock signal and a cache clock signal. The microprocessor clock signal is input directly to the processing unit 115 for timing and operation of the microprocessor. The cache clock signal is input to a delay line 150. The delay line 150 delays the cache clock signal a predetermined amount, and the delayed cache clock signal is transmitted to the cache memory die 120 via the bus 130. The operation of the clock generation circuit 140, the delay line 150 and the transmission line characteristics of bus 130 result in providing the cache clock signal synchronous with the microprocessor clock signal as will be described more fully below.

Figure 2:
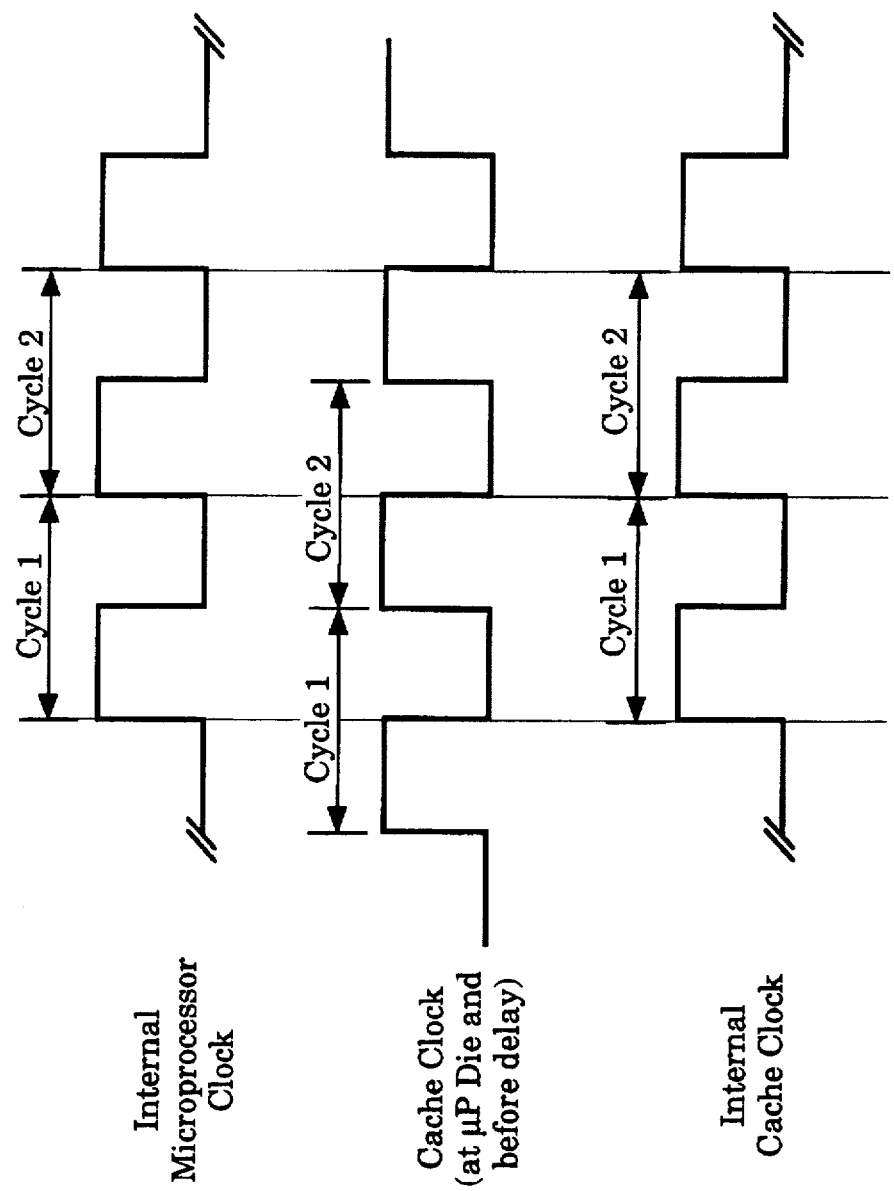
FIG. 2 illustrates a microprocessor clock signal, a cache clock signal on the microprocessor die and before delay, and an internal cache clock signal on the cache memory die, configured in accordance with the present invention.

Referring to FIG. 2, a microprocessor clock signal, a cache clock signal on the microprocessor die and before delay, and an internal cache clock signal on the cache memory die, configured in accordance with the present invention are illustrated. The cache clock is transmitted from the host die, microprocessor die 110, to the secondary die, cache memory die 120. The physical distance between the host die and the secondary die results in a propagation delay when transmitting the cache clock signal from the host die to the secondary die. Therefore, in order to synchronize the microprocessor clock signal with the cache clock signal, compensation is made for the propagation delay. The internal microprocessor clock signal is shown in FIG. 2 designated with specific clock cycles. The cache clock signal output from the clock generation circuit 140, and before input to delay 150, is shown below the microprocessor clock signal in FIG. 2. The cache clock signal, at the output of clock generation circuit 140, is the inverse of the microprocessor clock signal. To synchronize the cache clock signal with the microprocessor signal, clock cycles for the cache clock signal are defined such that the cache clock signal leads the microprocessor clock signal in phase by 180°. By designating the clock cycle to begin at the cache clock signal 180° before the microprocessor clock signal, no delay of the microprocessor clock signal is required.

Also shown in FIG. 2 is the internal cache clock signal at the cache die 120. As discussed above, the transmission of the cache clock signal from the microprocessor die 110 to the cache memory die 120 results in a delay. The amount of delay caused by the transmission is a function of the frequency of the clock signal, the distance the signal is propagated, and the transmission line characteristics of the transmitting media. In a preferred embodiment, the microprocessor and cache clock signals have a frequency of 150 mega Hertz (MHz). The distance between the microprocessor and cache memory results in a propagation delay for the cache clock signal of approximately 100 to 200 pico seconds. Based on the propagation delay and clock frequency, addition delay of the cache clock signal, such as on-chip components and delay lines, is required for precise synchronization. As shown in FIG. 2, the combination of the clock propagation delay and the additional delay results in one half clock cycle delay when transmitting the cache clock signal from microprocessor die 110 to the cache memory die 120. Accordingly, the internal cache clock at the cache memory die 120 is synchronized with the internal microprocessor clock on the microprocessor die 110.

As discussed above, in order to provide precise synchronization of the microprocessor clock signal on the microprocessor die 110 and the cache clock signal at the cache memory die 120, delay may be introduced to the cache clock signal by the delay line 150. Introducing delay with the delay line 150 permits transmitting the cache clock signal to a cache memory die at distances resulting in propagation delays less than one half clock cycle. Although use of a delay line for the cache clock signal may be required to provide precise synchronization, no delay is required for the microprocessor clock signal. Subsequently, the microprocessor clock is synchronized with the cache clock signal and no jitter, due to delay, is introduced on the microprocessor clock signal. In addition, because a clock cycle for the cache clock signal on the microprocessor die is leading the microprocessor clock signal by one half clock cycle, only a small amount of delay is required for the cache clock signal. Reducing or eliminating the need for delay in the cache clock signal minimizes jitter and improves signal integrity. In a multiple cache die arrangement, a plurality of delay lines, one for each cache clock signal, may be implemented to delay cache clock signals an amount in accordance with the corresponding propagation delay times. The use of delay lines for delaying digital clock signals is well known in the art and will not be described further.

Figure 3:
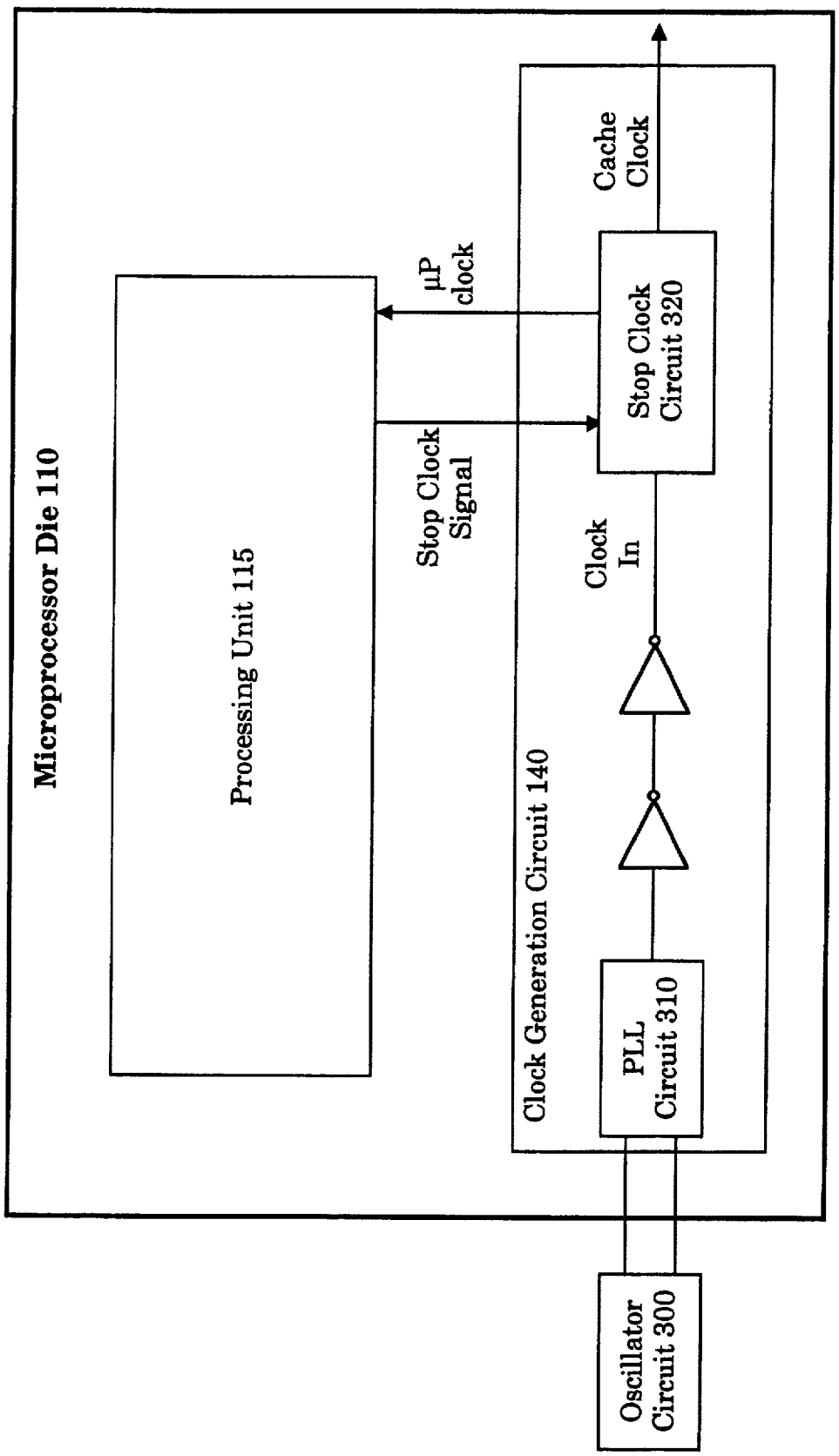
FIG. 3 illustrates a preferred embodiment for the clock generation circuit configured in accordance with the present invention.

Referring to FIG. 3, a preferred embodiment for the clock generation circuit configured in accordance with the present invention is illustrated. In addition to generating the microprocessor clock signal and the cache clock signal, the clock generation circuit 140 receives a stop clock signal from the processing unit 115. The stop clock signal is input to the stop clock circuit 320 which halts both the microprocessor clock signal and the cache clock signal on the end of the same clock cycle. Operation of the stop clock circuit 320 is explained more fully below. To generate the microprocessor and cache clock signals, the clock generation circuit 140 receives a raw clock signal from the oscillator circuit 300. In a preferred embodiment, the oscillator circuit 300 resides external to the microprocessor die 110. A phase lock loop (PLL) circuit 310 receives the raw clock signal and performs a variety of frequency tuning functions. For example, the PLL circuit 310 may receive an input to adjust the frequency in accordance with the operation of the phase lock loop circuit. The output of the PLL circuit 310 is buffered by dual inverters, and subsequently input to the stop clock circuit 320.

Figure 4:
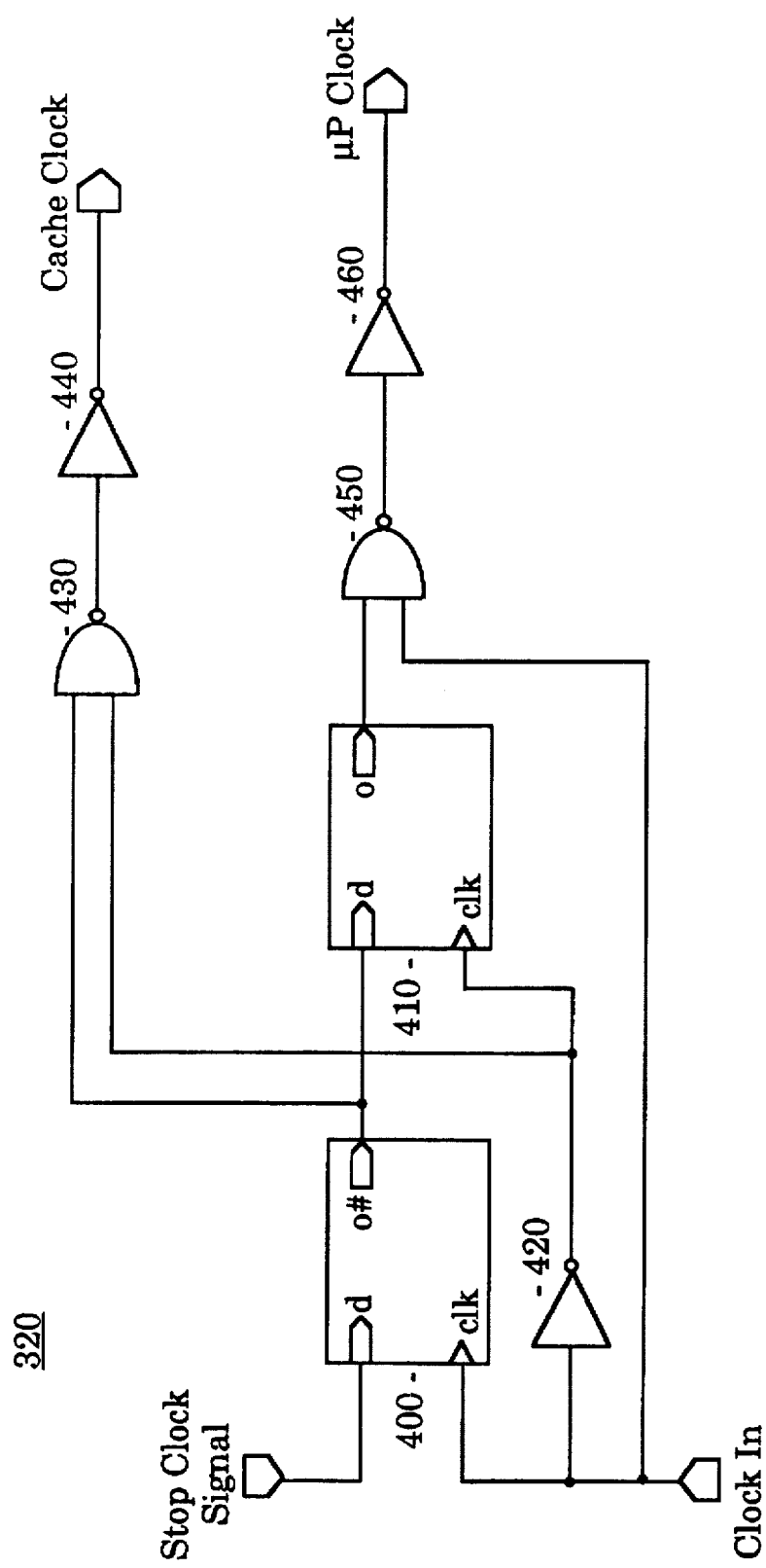
FIG. 4 illustrates a stop clock circuit configured in accordance with a preferred embodiment of present invention.
Figure 5:
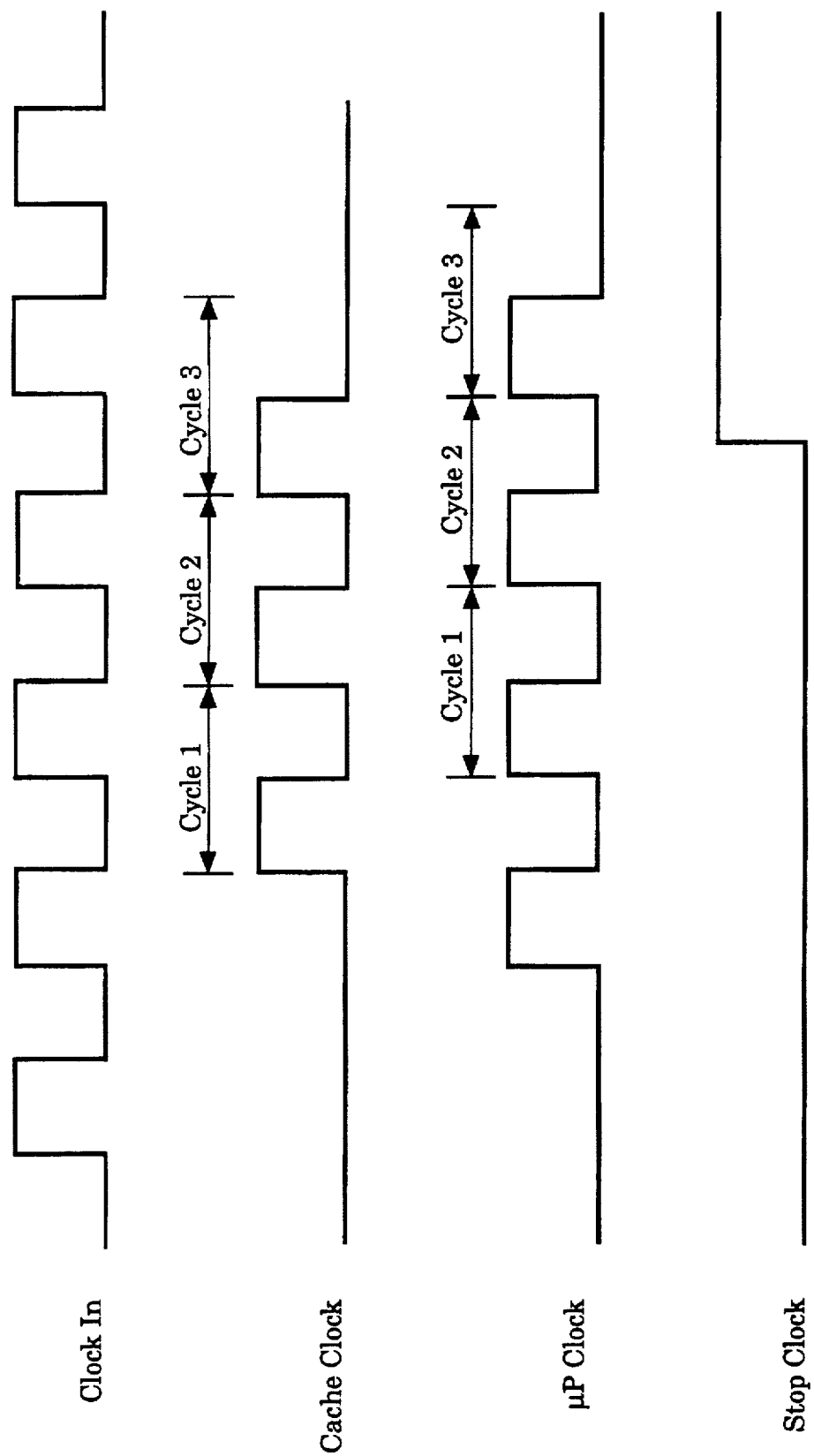
FIG. 5 illustrates a clock in, a cache clock, a microprocessor clock and a stop clock signal utilized in a preferred embodiment of the present invention.

Referring to FIG. 4, a stop clock circuit configured in accordance with a preferred embodiment of present invention is illustrated. The stop clock circuit 320 contains two D type flip flops 400 and 410 and a number of logic gates. In FIG. 5, the clock in, cache clock, microprocessor clock and stop clock signals are shown. In operation, the clock in signal is input to inverter 420, D type flip-flop 400 and NAND gate 450. To generate the cache clock signal, the stop clock signal is input to the D type flip-flop 400. On the next clock in cycle, the inverted output, O#, of flip-flop 400 is input to a NAND gate 430. Also input to the NAND gate 430 is the output of the inverter 420. The output of the NAND gate 430 is inverted by an inverter 440 to generate the cache clock signal on the microprocessor die 110. A low logic level on the stop clock signal indicates the stop clock function is inactive. When the stop clock signal is inactive, the output of the flip-flop 400 is a high logic level signal. Therefore, as shown in FIG. 5, the cache clock signal is an inverted clock in signal delayed by one clock cycle.

To generate the microprocessor clock signal, the output from inverter 420 is input to the flip-flop 410 as the clock. The O# of flip flop 400 is the input to flip-flop 410. The output of flip-flop 410 is input to the NAND gate 450. Also input to NAND gate 450 is the clock in signal. The output of the NAND gate 450 is inverted by an inverter 460 to generate the microprocessor clock signal. In operation, when the stop clock is inactive, the input to flip-flop 410 is a high logic level. The flip flop 410 is clock by the inverse of the clock in signal, and the output is a high logic level. The output of NAND gate 450 is determined by the state of the clock in signal delayed by two clock in cycle periods. The inverter 450 inverts the output of NAND gate 450 resulting in the signal shown in FIG. 5 when the stop clock signal is a low logic level.

FIG. 5 shows the transition of the stop clock signal from the inactive state to the active state during a third clock cycle of the cache clock signal and a second clock cycle of the microprocessor clock signal. When the stop clock signal transitions to a high logic level, the O# output of flip-flop 400 becomes a low logic level. Consequently, the cache clock signal remains in a low logic level commencing with the next cycle of the clock in signal as shown in FIG. 5. The low logic level output of flip-flop 400 is input to the flip-flop 410. However, because flip-flop 410 is cascaded with flip flop 400, the resulting low logic level output of 410 does not occur until the next clock in cycle as shown in FIG. 5. In the next clock in cycle, the microprocessor clock signal resides in a low logic level. The stop clock circuit 320 ensures that the microprocessor clock signal and the cache clock signal halt on the end of the same clock cycle. By halting on the end of the same clock cycle, data integrity, in both the microprocessor and cache memory, are maintained.

Figure 6A:
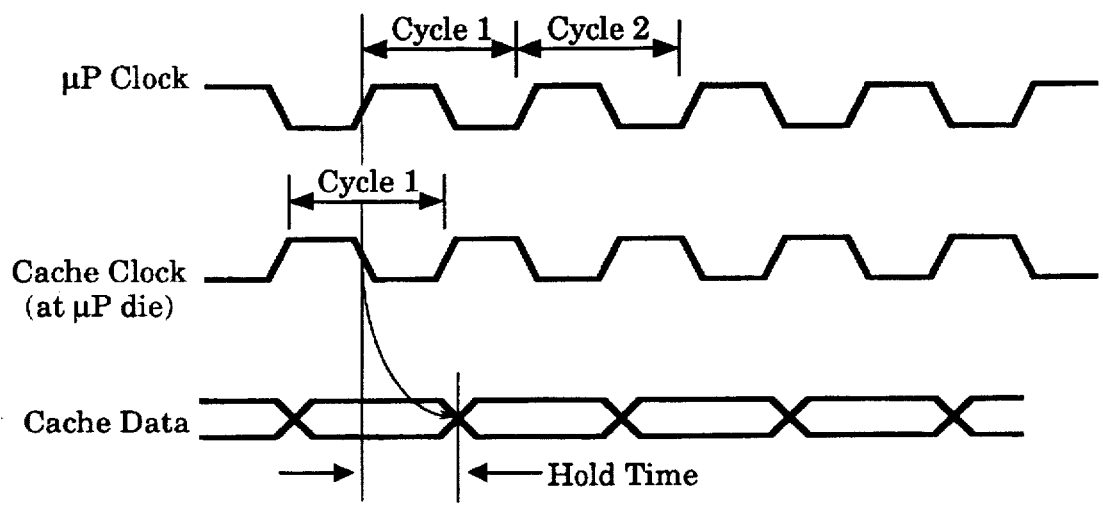
FIGS. 6a and 6b illustrate a microprocessor clock, a cache clock and a cache data signal utilized during data transfer cycles in a preferred embodiment of the present invention.

When the processing unit 115 on the microprocessor die 110 requests data from the cache memory on cache memory die 120, and the request results in a cache hit, data are transmitted from the cache memory die 120 to the microprocessor die 110 via the bus 130. In order to provide functional operation over a range of clock cycle frequencies, the data from cache memory die 120 becomes valid on the falling edge of the cache clock signal. Referring to FIG. 6a, the microprocessor clock, the cache clock and cache data are shown for a data transfer. In FIG. 6a on the cache data waveform, a minimum specified hold time is shown. On the falling edge of the cache clock signal, the cache data becomes valid for a time period specified by the minimum hold time. During the rising edge of a microprocessor clock signal, the data is sampled in the processing unit 115 at the microprocessor die 110. As shown in FIG. 6a, if the cache data is validated on the falling edge of the cache clock cycle, the data is still valid during the rising edge of the microprocessor clock on the same clock cycle.

Figure 6B:
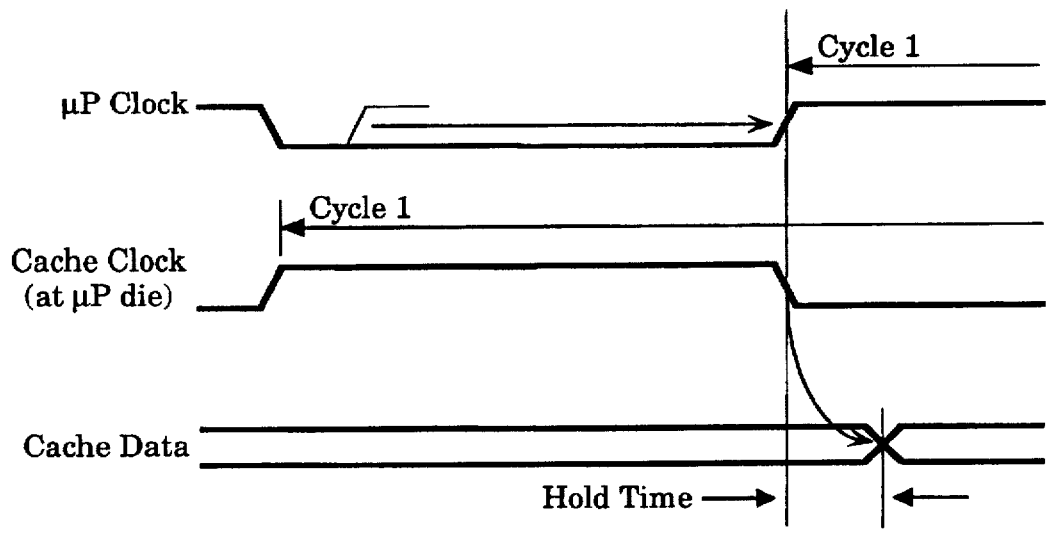

Referring to FIG. 6b, a data transfer cycle with a slower clock frequency is illustrated. For the data transfer illustrated in FIG. 6b, the cache data are valid for the same minimum hold time period. Note that although the microprocessor and cache clock frequencies are reduced, the data transfer, with the same minimum hold time, is not affected. Also, if the cache data became valid on the rising edge of the cache clock, then a reduced frequency would result in non-compliance with the minimum hold time requirement. Consequently, due to the phase differences between the cache clock and the microprocessor clock, and the need to remain compatible across a variety of frequencies, data are clocked on the falling edge of the cache clock signal at the cache memory die 120, and sampled on the rising edge of the microprocessor clock signal at the microprocessor die 110 for the same clock cycle.

Figure 7:
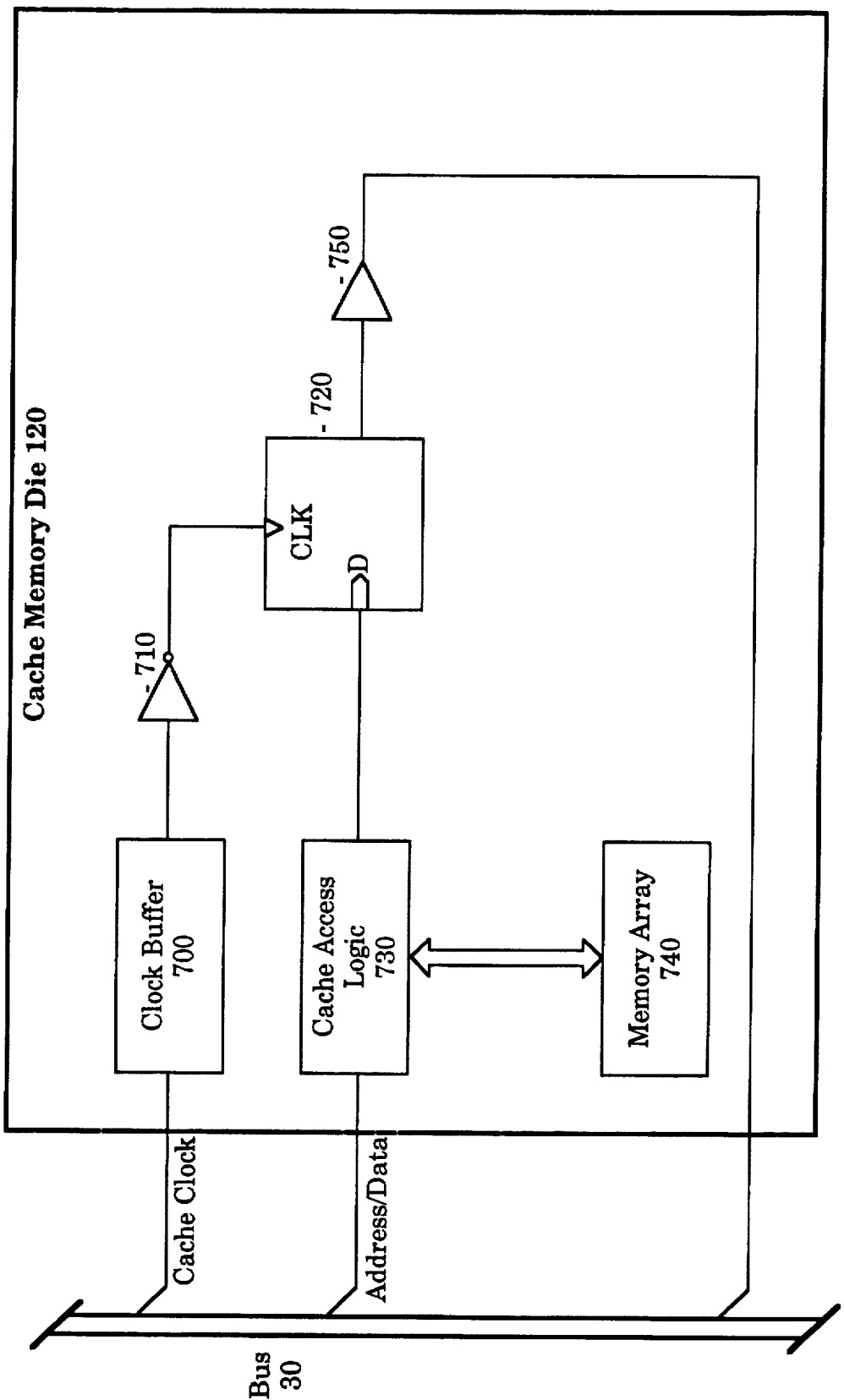
FIG. 7 illustrates a data interface for the cache memory die configured in accordance with the present invention.

Referring to FIG. 7, a data interface for the cache memory die configured in accordance with the present invention is illustrated. The cache memory die 120 contains cache access logic 730 and memory array 740. In order to retrieve data from the memory array 740, an address is input to the cache access logic 730. The cache access logic 730 determines whether the requested address resides in the memory array 740, and if so, accesses the memory array 740 at the specified location. Consequently, cache access logic 730 contains cache tag arrays and other logic for accessing memory array 740. Cache access logic 730 is intended to represent a broad category of cache memory support logic, which is well known in the art and will not be described further. When a cache hit occurs, the cache access logic 730 inputs data to flip-flop 720. The cache clock signal from the bus 130 is input to a clock buffer 700. In order to provide data on the falling edge of the cache clock signal, the buffered clock signal is input to an inverter 710. The inverted cache clock signal is input to the clock port of the flip flop 720. Consequently, with the hardware provided in the cache memory die 120, data is clocked on the failing edge of the cache clock signal. The output of flip flop 720 is buffered to provide valid drive for the data on the bus 30.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for synchronizing clock signals in a circuit comprising a plurality of integrated circuit dies including a host die and at least one secondary die, said method comprising the steps of:

generating a first clock signal on said host die;

inverting said first clock signal to generate a second clock signal for each secondary die;

defining a plurality of clock cycles for synchronous data transfer between said host die and said at least one secondary die such that each of said clock cycles begin, in reference to said second clock signal, one half cycle before each of said clock cycles begin, in reference to said first clock signal;

delaying said second clock signal one half clock cycle minus a propagation delay from said host die to a respective one of said plurality of secondary dies;

transmitting said second clock signal to each of said plurality of secondary dies;

receiving said first clock signal and said second clock signal in a stop clock circuit; and asserting a stop clock signal to said stop clock circuit to halt said first clock signal and said second clock signal upon termination of the same clock cycle.

2. The method as claimed in claim 1 further comprising the steps of:

providing a bus to couple said host die with said at least one secondary die to effectuate data transfer;

latching data on said bus on a falling edge of said second clock signal in a specified clock cycle; and sampling, at said host die, said data latched on a rising edge of said first clock signal during said specified clock cycle.

3. The method as claimed in claim 1 wherein said host die and said at least one secondary die are housed together in a single integrated circuit package.

4. The method as claimed in claim 1 wherein:

said host die comprises a microprocessor circuit; and said at least one of said secondary dies comprises a cache memory for use in conjunction with said microprocessor circuit.

5. The method of claim 1 wherein said stop clock circuit is included in said host die.

6. In a circuit comprising a plurality of integrated circuit dies including a host die and at least one secondary die, an apparatus for synchronizing clock signals on said plurality of integrated circuit dies, said apparatus comprising:

clock generation means for generating a first clock signal on said host die;

inverter means coupled to said clock generation means to receive said first clock signal from said clock generation means, and for inverting said first clock signal to generate a second clock signal for each secondary die, a plurality of clock cycles being designated for synchronous data transfer between said host die and said at least one secondary die such that each of said clock cycles begin, in reference to said second clock signal, one half cycle before each of said clock cycles begin, in reference to said first clock signal;

delay means coupled to said inverter means for delaying said second clock signal one half clock cycle minus a propagation delay from said host die to a respective one of said plurality of secondary dies;

transmission means coupled to said delay means for transmitting said second clock signal to each of said plurality of secondary dies;

circuit means for receiving said first clock signal and said second clock signal; and stop clock means for asserting a stop clock signal to said circuit means to halt said first clock signal and said second clock signal upon termination of the same clock cycle.

7. The apparatus as claimed in claim 6 wherein:

said transmission means comprises bus means for effectuating data transfer between said at least one secondary die and said host die;

latching means coupled to said bus means on each secondary die for latching data on said bus means on a falling edge of said second clock signal in a specified clock cycle; and sampling means on said host die for sampling said data latched at a rising edge of said first clock signal during said specified clock cycle.

8. The apparatus as claimed in claim 6 wherein said host die and said at least one secondary die are housed together in a single integrated circuit package.

9. The apparatus as claimed in claim 6 wherein:

said host die comprises processor means; and said at least one of said secondary dies comprises a cache memory for use in conjunction with said processor means.

10. The apparatus of claim 6 wherein said circuit means is included in said host die.

11. In a circuit comprising a plurality of integrated circuit dies including a host die and at least one secondary die, an apparatus for synchronizing clock signals on said plurality of integrated circuit dies, said apparatus comprising:

a clock oscillator circuit that generates a first clock signal on said host die;

an inverter coupled to said clock oscillator circuit to receive said first clock signal from said clock oscillator circuit, and that inverts said first clock signal to generate a second clock signal for each secondary die, a plurality of clock cycles being designated for synchronous data transfer between said host die and said at least one secondary die such that each of said clock cycles begin, in reference to said second clock signal, one half cycle before each of said clock cycles begin, in reference to said first clock signal;

at least one delay line coupled to said inverter to receive said second clock signal, said at least one delay line for delaying said second clock signal for each secondary die one half clock cycle minus a propagation delay from said host die to a respective said at least one secondary die;

a bus coupling said at least one secondary die to said host die, said bus for transmitting said second clock signal to each of said at least one secondary die;

a stop clock circuit to receive said first clock signal and said second clock signal; and stop clock logic to assert a stop clock signal to said stop clock circuit to halt said first clock signal and said second clock signal upon termination of the same clock cycle.

12. The apparatus as claimed in claim 11 wherein:

said bus transfers data between said at least one secondary die and said host die;

a flip-flop coupled to said bus on each secondary die for latching said data on said bus on a falling edge of said second clock signal in a specified clock cycle; and a latch coupled to said bus on said host die for sampling said data latched at a rising edge of said first clock signal during said specified clock cycle.

13. The apparatus as claimed in claim 11 wherein said host die and said at least one secondary die are housed together in a single integrated circuit package.

14. The apparatus as claimed in claim 11 wherein:

said host die comprises a microprocessor circuit; and said at least one of said secondary dies comprises a cache memory for use in conjunction with said microprocessor circuit.

15. The apparatus of claim 11 wherein said stop clock circuit is included in said host die.

16. A computer system comprising:

a microprocessor circuit including a stop clock function that generates a stop clock signal;

at least one cache memory;

an interface circuit for coupling said microprocessor circuit to said at least one cache memory for data transfer, said interface circuit comprising:

a clock generation circuit that generates a microprocessor clock at said microprocessor for said microprocessor circuit and that generates at least one cache memory clock for said at least one cache memory by inverting said microprocessor clock, and that synchronizes said microprocessor clock with said at least one cache memory clock, at said at least one cache memory by defining a plurality of clock cycles for data transfer between said microprocessor circuit and said at least one cache memory such that each of said clock cycles begin, in reference to said second clock signal, one half cycle before each of said clock cycles begin, in reference to said first clock signal; and a stop clock circuit coupled to said clock generation circuit and said microprocessor circuit, said stop clock circuit for receiving said microprocessor clock, said at least one cache memory clock and a stop clock signal from said microprocessor circuit such that activation of said stop clock signal results in said stop clock circuit halting said microprocessor clock and said cache memory clock upon termination of the same clock cycle.

17. The computer system as claimed in claim 16, wherein said interface circuit further comprises:

a flip-flop on each cache memory for latching data on a falling edge of said cache memory clock in a specified clock cycle; and a latch on said microprocessor for sampling said data at a rising edge of said microprocessor clock during said specified clock cycle.

18. The computer system as claimed in claim 16, wherein said clock generation circuit comprises at least one delay line coupled to receive said cache memory clock, said at least one delay line delaying said cache memory clock one half clock cycle minus a propagation delay from said microprocessor to a respective said at least one cache memory.

19. The computer system as claimed in claim 16, wherein said stop clock circuit comprises two D type flip-flops cascaded, said stop clock circuit receiving said stop clock signal such that an active stop clock signal causes a first D type flip-flop, upon expiration of a first subsequent clock cycle, to halt said second clock signal, and a second D type flip-flop, upon expiration of a second subsequent clock cycle, to halt said second clock signal, said first and second clock signals being halted upon termination of the same clock cycle.

20. The computer system as claimed in claim 16, wherein said microprocessor circuit and said clock generation circuit are located on a host die, an said at least one cache memory is located on a separate secondary die.

21. The computer system as claimed in claim 20, wherein said host die and said secondary die are constructed in a single integrated circuit package.

22. The apparatus as claimed in claim 11 wherein said stop clock logic includes a first flip-flop cascaded with a second flip-flop and said stop clock signal causes the first flip-flop, upon expiration of a first subsequent clock cycle, to halt said second clock signal, and the second flip-flop, upon expiration of a second subsequent clock cycle, to halt said first clock signal, said first and second clock signals being halted upon termination of the same clock cycle relative to said host die and said at least one secondary die.

23. The computer system as claimed in claim 20, wherein said host die and said secondary die are housed together in a single integrated circuit package.

* * * * *